US012587175B2

(12) United States Patent
Fujiwara et al.

(10) Patent No.: US 12,587,175 B2
(45) Date of Patent: Mar. 24, 2026

(54) REDUCED POWER CONSUMPTION COMPUTE-IN-MEMORY SYSTEM, METHOD OF OPERATING SAME

(71) Applicant: TAIWAN SEMICONDUCTOR MANUFACTURING COMPANY, LTD., Hsinchu (TW)

(72) Inventors: Hidehiro Fujiwara, Hsinchu (TW); Je-Min Hung, Hsinchu (TW); Haruki Mori, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/752,125

(22) Filed: Jun. 24, 2024

(65) Prior Publication Data

US 2025/0239998 A1     Jul. 24, 2025

Related U.S. Application Data

(60) Provisional application No. 63/622,387, filed on Jan. 18, 2024.

(51) Int. Cl.
| | |
|---|---|
| *H03K 3/012* | (2006.01) |
| *H03K 3/3562* | (2006.01) |
| *H03K 19/00* | (2006.01) |
| *H03K 19/17728* | (2020.01) |

(52) U.S. Cl.
CPC .......... *H03K 3/012* (2013.01); *H03K 3/3562* (2013.01); *H03K 19/0016* (2013.01); *H03K 19/17728* (2013.01)

(58) Field of Classification Search
CPC .. H03K 3/012; H03K 3/3562; H03K 19/0016; H03K 19/17728
See application file for complete search history.

(56) References Cited

U.S. PATENT DOCUMENTS

| | | | | |
|---|---|---|---|---|
| 5,465,261 A | * | 11/1995 | Deschene | ............. H03M 13/17 |
| | | | | 714/759 |
| 5,933,035 A | * | 8/1999 | Bezzant | ............. H03K 5/00006 |
| | | | | 327/119 |
| 2014/0122555 A1 | | 5/2014 | Hickmann et al. | |
| 2020/0007142 A1 | * | 1/2020 | Murphy | ............... H03K 5/2427 |
| 2025/0239998 A1 | * | 7/2025 | Fujiwara | ................ H03K 3/012 |

FOREIGN PATENT DOCUMENTS

| | | |
|---|---|---|
| TW | I812391 | 8/2023 |

* cited by examiner

*Primary Examiner* — Sibin Chen
(74) *Attorney, Agent, or Firm* — Hauptman Ham, LLP

(57) ABSTRACT

A compute-in-memory (CIM) system includes a first leader-follower (L/F) flip-flop (FF), a suspender unit and a multiplication unit. The first L/F FF is configured to receive a data signal. The first L/F FF includes: a first leader FF configured to receive the data signal and a first follower FF configured to generate a signal first_Q_follow that represents a output signal of the first L/F FF. The multiplication unit is configured to receive a weight signal W and the signal first_Q_follow and generate a first product signal. The suspender unit is configured, during a given cycle of the first clock signal, detect that a first scenario is true in which all bits b(k) of the data signal equal logical zero and accordingly suppress latching from being performed by the first L/F FF, and control the multiplication unit to generate the first product signal as being equal to logical zero.

20 Claims, 8 Drawing Sheets

600

REDUCED POWER CONSUMPTION COMPUTE-IN-MEMORY SYSTEM, METHOD OF OPERATING SAME

PRIORITY CLAIM

This application claims the priority of U.S. Provisional Application No. 63/622,387, filed Jan. 18, 2024, which is incorporated herein by reference in its entirety.

BACKGROUND

The semiconductor integrated circuit (IC) industry produces a wide variety of analog and digital devices to address issues in a number of different areas. Developments in semiconductor process technology nodes have progressively reduced component sizes and tightened spacing resulting in progressively increased transistor density. ICs have become smaller.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

DETAILED DESCRIPTION

Figure 1A:
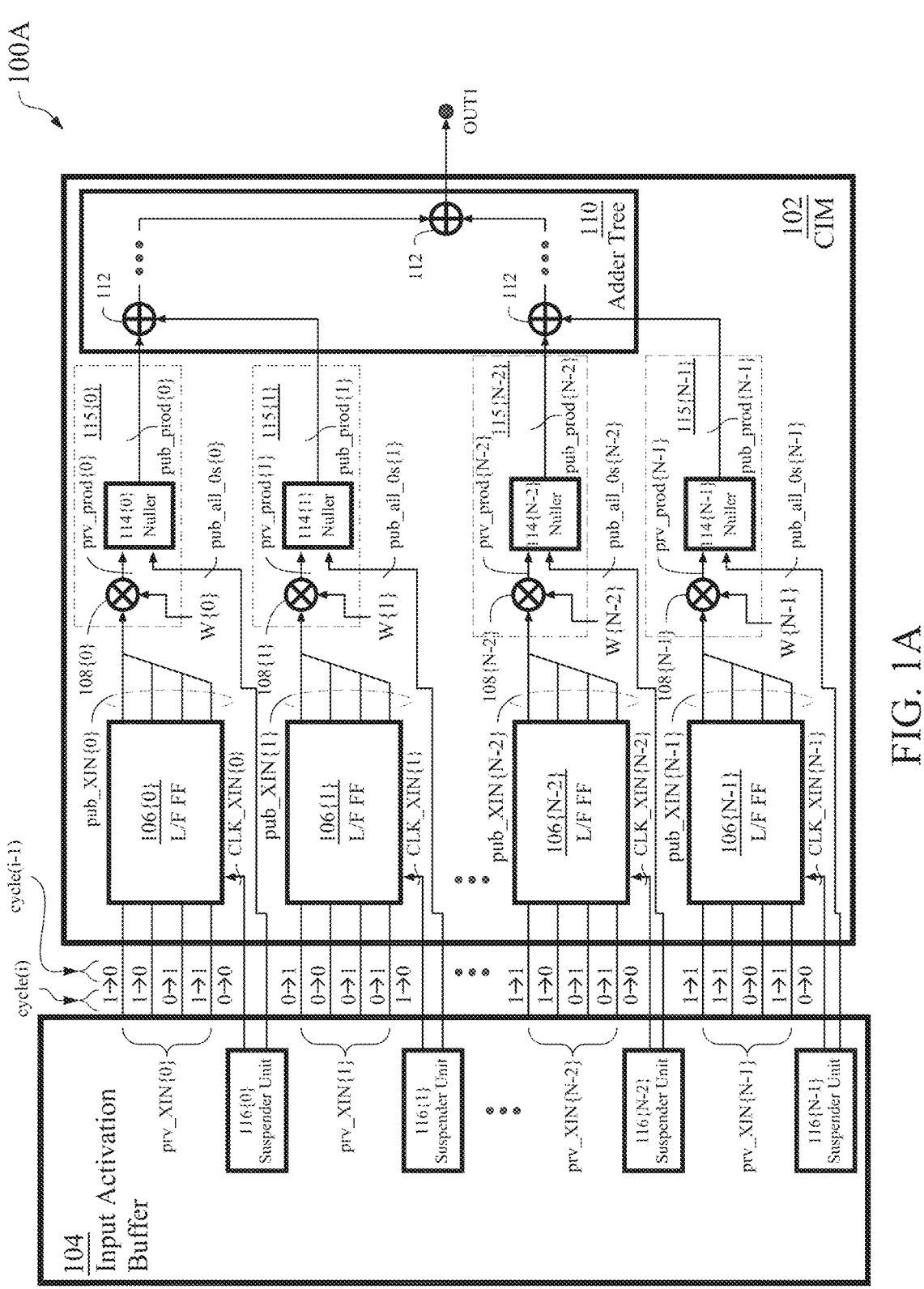
FIGS. 1A-1B are corresponding schematic diagrams, in accordance with some embodiments.

The following disclosure discloses many different embodiments, or examples, for implementing different features of the subject matter. Examples of components, materials, values, steps, operations, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows include embodiments in which the first and second features are formed in direct contact, and further include embodiments in which additional features are formed between the first and second features, such that the first and second features are in indirect contact. In addition, the present disclosure repeats reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, are used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus is otherwise oriented (rotated 90 degrees or at other orientations) and the spatially relative descriptors used herein are likewise interpreted accordingly.

In some embodiments, the term standard cell structure refers to a standardized building block included in a library of various standard cell structures. In some embodiments, various standard cell structures are selected from a library thereof and are used as components in a layout diagram representing a circuit.

In some embodiments, a compute-in-memory (CIM) system includes a first leader-follower (L/F) flip-flop (FF), a suspender unit and a multiplication unit. The first L/F FF is configured to receive a multibit data signal and generate a multibit output signal. The first L/F FF includes: a first leader FF configured to receive the data signal and generate a signal first_Q_lead; and a first follower FF configured to receive the signal first_Q_lead and generate a signal first_Q_follow that represents the output signal of the first L/F FF. At an $i-1$_th cycle of a first clock signal, at least one bit b(k) of data signal is equal to logical one, where i and k are corresponding integers. The multiplication unit is configured to receive a multibit weight signal and the signal first_Q_follow and generate a first product signal. The suspender unit is configured, during an i_th cycle of the first clock signal, to do as follows including: detect that a first scenario is true in which all bits b(k) of the data signal equal logical zero; and when the first scenario is true, suppress latching from being performed by the first L/F FF and control the multiplication unit to generate the first product signal as being equal to logical zero. In some embodiments, the multiplication unit includes a multiplier and a nulling logic unit. In some embodiments, the multiplication unit does not include the nulling logic unit.

According to another approach, a counterpart system does not include a counterpart of the suspender unit. According to the other approach, for a cycle in which all bits b(k) of a counterpart of the data signal are logical zero in value, nevertheless all bits b(k) are propagated through the other approach's counterpart of the first L/F FF such that the other approach's counterpart of the multiplication unit, namely a multiplier, multiplies the counterpart of the weight signal by logical zero resulting in all bits of the counterpart of the first product signal being logical zero. In developing at least some of the present embodiments, one or more of the present inventors recognized at least the following: regardless of bit-value, propagating all bits b(k) of the counterpart data signal through the counterpart of the first L/F FF consumes energy; and it is possible to make the counterpart first product signal equal to logical zero without having to propagate all bit-values of bits b(k) of the counterpart data signal through the counterpart first L/F FF, which presents an opportunity to reduce energy consumption as compared to the other approach. Accordingly, when all bits b(k) of the data signal are logical zero, the suspender unit (and, in some embodiments, in combination with the multiplication unit) achieve e generation of the first product signal with all bits b(k) equal logic zero without having to propagate the bit-values of all bits b(k) of the data signal through the first L/F FF. By avoiding such propagation, the systems according to some embodiments reduce energy consumption when all bits b(k) of the data signal are logical zero as compared to the other approach.

FIG. 1A is a schematic diagram of a system 100A, in accordance with some embodiments.

System 100A includes a compute-in-memory (CIM) system 102 and an input activation buffer 104. System 100A is configured to reduce power consumption by CIM system 102.

CIM system 102 includes multibit leader/follower (L/F) flip-flops (FFs) 106{1}, 106{1}, . . . , 106{N−2} and 106{N−1}, where N is a positive integer. An n_th example of L/F FFs 106{0}-106{N−1}, namely L/F FF 106{n}, is shown in in FIG. 1B. In some embodiments, an L/F FF is referred to as a master/slave (M/S) FF. In some embodiments, L/F FFs 106{0}-106{N−1} are a type of FF referred to as a D FF. In some embodiments, L/F FFs 106{0}-106{N−1} are a type of FF of than a D FF.

L/F FFs 106{0}, 106{1}, . . . , 106{N−2} and 106{N−1} are configured to receive corresponding multibit data signals prv_XIN{0}, prv_XIN{1}, . . . , prv_XIN{N−2} and prv_XIN{N−1} from input activation buffer 104. Each of data signals prv_XIN{0}-prv_XIN{N−1} has bits b(0)-b(L−1), where L is an integer. As such, for $0 \leq k \leq (L-1)$, bit b(k) is representative of bits b(0)-b(L−1).

L/F FFs 106{0}, 106{1}, . . . , 106{N−2} and 106{N−1} are further configured to generate corresponding data signals pub_XIN{0}, pub_XIN{1}, . . . , pub_XIN{N−2} and pub_XIN{N−1}. The outputs of L/F FFs 106{0}, 106{1}, . . . , 106{N−2} and 106{N−1} are coupled to corresponding multipliers 108{0}, 108{1}, . . . , 108{N−2} and 108{N−1}.

Multipliers 108{0}-108{N−1} are correspondingly configured to do as follows including: receive signals pub_XIN{0}, pub_XIN{1}, . . . , pub_XIN{N−2} and pub_XIN{N−1} as multiplicands; receive multibit weight signals W{0}, W{1}, . . . , W{N−2} and W{N−1} as multipliers; and generate private product signals prv_prod{1}, prv_prod{1}, . . . , prv_prod{N−2} and prv_prod{N−1}.

CIM system 102 further includes nulling logic units (nullers) 114{0}, 114{1}, . . . , 114{N−2} and 114{N−1} correspondingly configured to do as follows including: receive private product signals prv_prod{0}-prv_prod{N−1}; receive public nulling signals pub_all_0s{0}, pub_all_0s{1}, . . . , pub_all_0s{N−2} and pub_all_0s{N−1}; and generate public product signals pub_prod{0}, pub_prod{1}, . . . , pub_prod{N−2} and pub_prod{N−1}. Nullers 114{0}-114{N−1} are discussed below. In some embodiments, each of nullers 114{0}-114{N−1} includes a corresponding logical NOR gate.

Considered together, multiplier 108{0} and nuller 114{0} represent a multiplication unit 115{0}. Similarly, considered together, multipliers 108{1}-108{N−1} and nullers 114{1}-114{N−1} represent corresponding multiplication units 115{1}-115{N−1}.

CIM system 102 further includes an adder tree 110 that includes instances of summing units (adders) 112. Adder tree 110 is configured to receive public product signals pub_prod{0}-pub_prod{N−1} from corresponding nullers 114{0}-114{N−1} and to add the same together. Adder tree 110 has courses of instances of adder 112, where the courses are cascaded together. In some embodiments, adder tree 110 has J courses, crs(0), . . . , crs(J−1), of adders 112, where J is a positive integer and J<N. In some embodiments, the number J of courses in adder tree 110 relates to the N number of signals pub_XIN{0}, pub_XIN{1}, . . . , pub_XIN{N−2} and pub_XIN{N−1} as follows: N equals 2 raised to the J power, i.e., $N=2^J$. Adder tree 110 is configured to receive the N number of signals pub_XIN{0}, pub_XIN{1}, . . . , pub_XIN{N−2} and pub_XIN{N−1} and generate a single word as output signal OUT1. Each instance of adder 112 is configured to receive two single-word-inputs. In some embodiments, the bit-capacity of the instances of adder 112 in each successive course increase by one bit. For example, where each instance of adder 112 in course crs(0) is a j bit adder, each instance of adder 112 in course crs(1) is a j+1 bit adder, where j is a positive integer.

Public nulling signals pub_all_0s{0}-pub_all_0s{N−1} indicate whether all bits b(k) of corresponding data signals prv_XIN{0}, prv_XIN{1}, . . . , prv_XIN{N−2} and prv_XIN{N−1} are logical zero for the i_th cycle of a global clock CLK, CLK(i) (see FIG. 1B), where i is an integer. Public nulling signals pub_all_0s{0}-pub_all_0s{N−1} are generated correspondingly by suspender units 116{0}, 116{1}, . . . , 116{N−2} and 116{N−1}(see FIG. 1B).

Input activation buffer 104 includes suspender units 116{0}-116{N−1} and arrays (see 132 FIG. 1B) of one-bit memory cells (not shown). The arrays of one-bit memory cells buffer correspondingly generate buffer data signals prv_XIN{0}-prv_XIN{N−1}. FIG. 1A assumes that each of data signals prv_XIN{0}-prv_XIN{N−1} is a four bit signal, for simplicity of illustration. In some embodiments, each of data signals prv_XIN{0}-prv_XIN{N−1} is multibit signal in which the number of bits is a number other than four. In FIG. 1A, the one-bit memory cells are assumed to be static random access memory (SRAM) cells. In some embodiments, the one-bit memory cells are a type of memory cell other than SRAM.

Figure 1B:
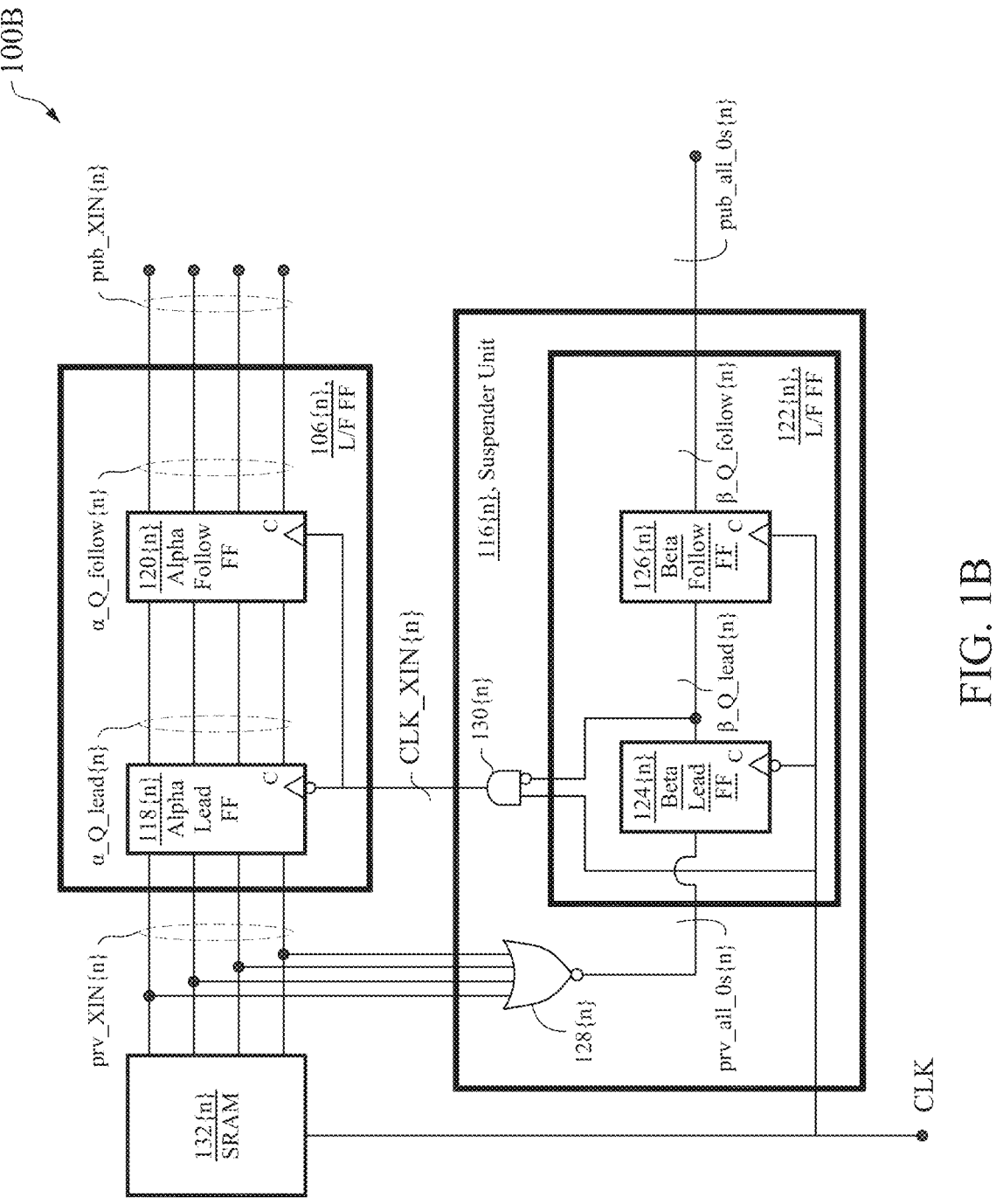

Suspender units 116{0}-116{N−1} also generate corresponding local clocks CLK_XIN{0}, CLK_XIN{1}, . . . , CLK_XIN{N−2} and CLK_XIN{N−1}(see FIG. 1B). Global clock CLK is received by each of suspender units 116{0}-116{N−1} whereas local clocks CLK_XIN{0}-CLK_XIN{N−1} are correspondingly received by L/F FFs 106{0}-106{N−1}, hence the corresponding adjectives global and local.

For simplicity of discussion, FIG. 1A further assumes example values for each of data signals prv_XIN{0}-prv_XIN{N−1} for the i−1_th and i_th cycles of global clock CLK, i.e., CLK(i−1) and CLK(i). For CLK(i−1), the values of data signals prv_XIN{0}-prv_XIN{N−1} and corresponding public nulling signals pub_all_0s{0}-pub_all_0s{N−1} are assumed to be: prv_XIN{0}(i−1)={0, 0,1,1} and pub_all_0s{0}(i−1)=0; prv_XIN{1}(i−1)={1,0, 1,1} and pub_all_0s{1}(i−1)=0; prv_XIN{N−2}(i−1)={1,0, 1,0} and pub_all_0s{N−2}(i−1)=0; and prv_XIN{N−1}(i−1)={1,1,0,1} and pub_all_0s{N−1}(i−1)=0. In FIG. 1A, for CLK(i), the example values of data signals prv_XIN{0}-prv_XIN{N−1} are assumed to be: prv_XIN{0}(i)={1,1,0, 1} and pub_all_0s{0}(i)=0; prv_XIN{1}(i)={0,0,0,0} and pub_all_0s{1}(i)=1; prv_XIN{N−2}(i)={1,1,0,0} and pub_all_0s{N−2}(i)=0; and prv_XIN{N−1}(i)={1,1,0,1} and pub_all_0s{N−1}(i)=0.

Recalling that public nulling signals pub_all_0s{0}-pub_all_0s{N−1} indicate whether all bits b(k) of corresponding data signals prv_XIN{0}, prv_XIN{1}, . . . , prv_XIN{N−2} and prv_XIN{N−1} are logical zero for the corresponding cycle of clock signal CLK, FIG. 1A further assumes the following: each of public nulling signals pub_all_0s{0}(i−1)-pub_all_0s{N−1}(i−1) is assumed to be logical zero; each of public nulling signals pub_all_0s{0}(i) and pub_all_0s{2}(i−1)-pub_all_0s{N−1}(i−1) is assumed to be logical zero; and public nulling signal pub_all_0s{1}(i) is assumed to be logical one.

According to public nulling signals pub_all_0s{0}-pub_all_0s{N−1}, nullers 114{0}-114{N−1} are configured correspondingly to selectively null public product signals pub_prod{0}-pub_prod{N−1}. That is, according to public nulling signals pub_all_0s{0}-pub_all_0s{N–1}, nullers 114{0}-114{N–1} are configured correspondingly to generate public product signals pub_prod{0}-pub_prod{N–1} selectively as being equal to private product signals prv_prod{0}-prv_prod{N–1} or as all bits being equal to logical zero.

For simplicity of discussion, nuller 114{n} is taken as being representative of nullers 114{0}-114{N–1} and public nulling signal pub_all_0s{n} is taken as being representative of public nulling signals pub_all_0s{0}-pub_all_0s{N–1}. In some embodiments, nuller 114{n} represents an instance of nuller 114{n} for each bit b(k) of data signal prv_XIN{n}.

As used herein, generating public nulling signal pub_all_0s{n} as being all bits equal to logical zero for a given cycle of global clock CLK is understood as nulling, i.e., making null, public nulling signal pub_all_0s{n} for the given cycle of global clock CLK.

In some embodiments, nuller 114{n} is configured to generate a bit b(k) of public product signal pub_prod{n} to have a truth table as follows:

| | Truth Table | |
|---|---|---|
| nulling signal pub_all_0s{n} | bit b(k) of private product signal prv_prod{n} | bit b(k) of public product signal pub_prod{n} |
| 0 | 0 | 0 |
| 0 | 1 | 1 |
| 1 | 0 | 0 |
| 1 | 1 | 0 |

The context of rows 1-2 of the truth table is as follows: latching by L/F FF 106{n} is not suppressed such that the value of bit b(k) of the public data signal pub_XIN{n} (column 3 of the truth table) equals the value of bit b(k) of the private data signal prv_XIN{n} for the current global clock cycle CLK(i); and the value of bit b(k) of the private product signal prv_prod{n}(column 2 of the truth table) corresponds to the value of bit b(k) of the private data signal prv_XIN{n} for the global clock cycle CLK(i) such that the value of bit b(k) of public product signal pub_prod{n} is valid for the current global clock cycle CLK(i).

By contrast, the context of rows 3-4 of the truth table is as follows: latching by L/F FF 106{n} is suppressed such that the value of bit b(k) of the public data signal pub_XIN{n}(column 3 of the truth table) equals the value of bit b(k) of the private data signal prv_XIN{n} for the previous global clock cycle CLK(i–1); where the value of bit b(k) of the private product signal prv_prod{n} for the current global clock cycle CLK(i) is different than the value of bit b(k) of the private product signal prv_prod{n} for the previous global clock cycle CLK(i–1), consequently the value of bit b(k) of the private product signal prv_prod{n} (column 2 of the truth table) for the current global clock cycle CLK(i) does not correspond to the value of bit b(k) of the private data signal prv_XIN{n} for the current global clock cycle CLK(i); and where the value of bit b(k) of the private product signal prv_prod{n} for the current global clock cycle CLK(i) is different than the value of bit b(k) of the private product signal prv_prod{n} for the previous global clock cycle CLK(i–1), the value of bit b(k) of the private data signal prv_XIN{n} for the current global clock cycle CLK(i) is not valid and consequently the value of bit b(k) of the private product signal prv_prod{n} is not valid. However, the validity of the value of bit b(k) of the private data signal prv_XIN{n} for the current global clock cycle CLK(i) does not matter in the context of rows 3-4 at least for the following reasoning. The reasoning is that, regarding rows 3-4 of the truth table, the value of bit b(k) of public product signal pub_prod{n} is forced to logical zero by nuller 114{n} under the control of nulling signal pub_all_0x{n} irrespective of the value of bit b(k) of the private data signal prv_XIN{n}.

FIG. 1B is a schematic diagram of system 100B, in accordance with some embodiments.

System 100B is a version of system 100A that shows components of the latter in more detail, in accordance with some embodiments. For simplicity of discussion regarding FIG. 1B, it is assumed that suspender unit 116{n} is representative of suspender units 116{0}-116{N–1} of FIG. 1A. For simplicity of discussion, the following also will be used as representatives: data signal prv_XIN{n} as representative of data signals prv_XIN{0}-prv_XIN{N–1} of FIG. 1A; L/F FF 106{n} as representative of L/F FFs 106{0}-106{N–1} of FIG. 1A; data signal pub_XIN{n} as representative of data signals pub_XIN{0}-pub_XIN{N–1} of FIG. 1A; local clock CLK_XIN{n} as representative of local clocks CLK_XIN{0}-CLK_XIN{N–1} of FIG. 1A; and public nulling signal pub_all_0s{n} as representative of public nulling signals pub_all_0s{0}-pub_all_0s{N–1} of FIG. 1A.

System 100B includes an SRAM array 132 of one-bit memory cells (not shown) which represents a portion of input activation buffer 104 of FIG. 1A. SRAM array 132 is configured to output data signal prv_XIN{n}.

In FIG. 1B, L/F FF 106{n} includes a multibit alpha leader FF 118{n} and a multibit alpha follower FF 120{n}. In some embodiments, alpha leader FF 118{n} is referred to as alpha master FF 118{n} and alpha follower FF 120{n} is referred to as alpha slave FF 120{n}. In some embodiments, alpha leader FF 118{n} and alpha follower FF 120{n} are a type of FF referred to as a D FF. In some embodiments, alpha leader FF 118{n} and alpha follower FF 120{n} are a type of FF of than a D FF. Each of alpha leader FF 118{n} and alpha follower FF 120{n} has outputs Q and Q_bar (~Q) however the outputs Q_bar are not shown for simplicity of illustration.

Alpha leader FF 118{n} is configured to receive data signal prv_XIN{n} and generate a signal α_Q_lead{n}. Alpha leader FF 118{n} is further configured to receive an inverted version of local clock CLK_XIN{n} and be triggered on the falling edge of the same.

Alpha follower FF 120{n} is configured to receive signal α_Q_lead{n} and generate a signal α_Q_follow that represents the output signal of L/F FF 106{n}. Alpha follower FF 120{n} is further configured to receive local clock CLK_XIN{n} and be triggered on the rising edge of the same.

In FIG. 1B, suspender unit 116{n} includes: a logical NOR gate 128{n}; a single-bit L/F FF 122{n}; and a logical AND gate 130{n}. NOR gate 128{n} is configured to perform a logical NOR operation on all bits b(k) of data signal prv_XIN{n} and generate a private nulling signal prv_all_0s{n}.

L/F FF 122{n} includes a single-bit beta leader FF 124{n} and a single-bit beta follower FF 126{n}. In some embodiments, beta leader FF 124{n} is referred to as beta master FF 124{n} and beta follower FF 126{n} is referred to as beta slave FF 126{n}. In some embodiments, beta leader FF 124{n} and beta follower FF 126{n} are a type of FF referred to as a D FF. In some embodiments, beta leader FF 124{n} and beta follower FF 126{n} are a type of FF of than a D FF. Each of beta leader FF 124{n} and beta follower FF 126{n} has Q and Q_bar (~Q) outputs however the outputs Q_bar are not shown for simplicity of illustration.

Beta leader FF 124{n} is configured to receive private nulling signal prv_all_0s{n} and generate a signal β_Q_lead{n}. Beta leader FF 124{n} is further configured to receive an inverted version of global clock CLK and be triggered on the falling edge of the latter.

Beta follower FF 126{n} is configured to receive signal β_Q_lead{n} and generate a signal β_Q_follow that represents the output signal of L/F FF 122{n}, i.e., that represents public nulling signal pub_all_0s{n}. Beta follower FF 126{n} is further configured to receive global clock CLK and be triggered on the rising edge of the same. AND gate 130{n} is configured to receive global clock CLK and an inverted version of signal β_Q_lead{n} and generate local clock CLK_XIN{n}.

Recalling that FIG. 1A further assumes values for each of data signals prv_XIN{0}-prv_XIN{N-1} for the i-1_th and i_th cycles of global clock CLK, i.e., CLK(i-1) and CLK(i), FIG. 1B assumes values of data signal prv_XIN{0} of FIG. 1A as being equal to the values for data signal prv_XIN{n} likewise to simplify discussion. As such, for the i-1_th cycle of global clock CLK, i.e., CLK(i-1), global NOR gate 128{n} generates private nulling signal prv_all_0s{n} as being equal to logical zero because at least one bit b(k) of data signal prv_XIN{0} is logical one. Also as such, for the i_th cycle of global clock CLK, i.e., CLK(i), global NOR gate 128{n} generates private nulling signal prv_all_0s{n} as being equal to logical one because all bits b(k) of data signal prv_XIN{0} are logical zero.

Figure 2:
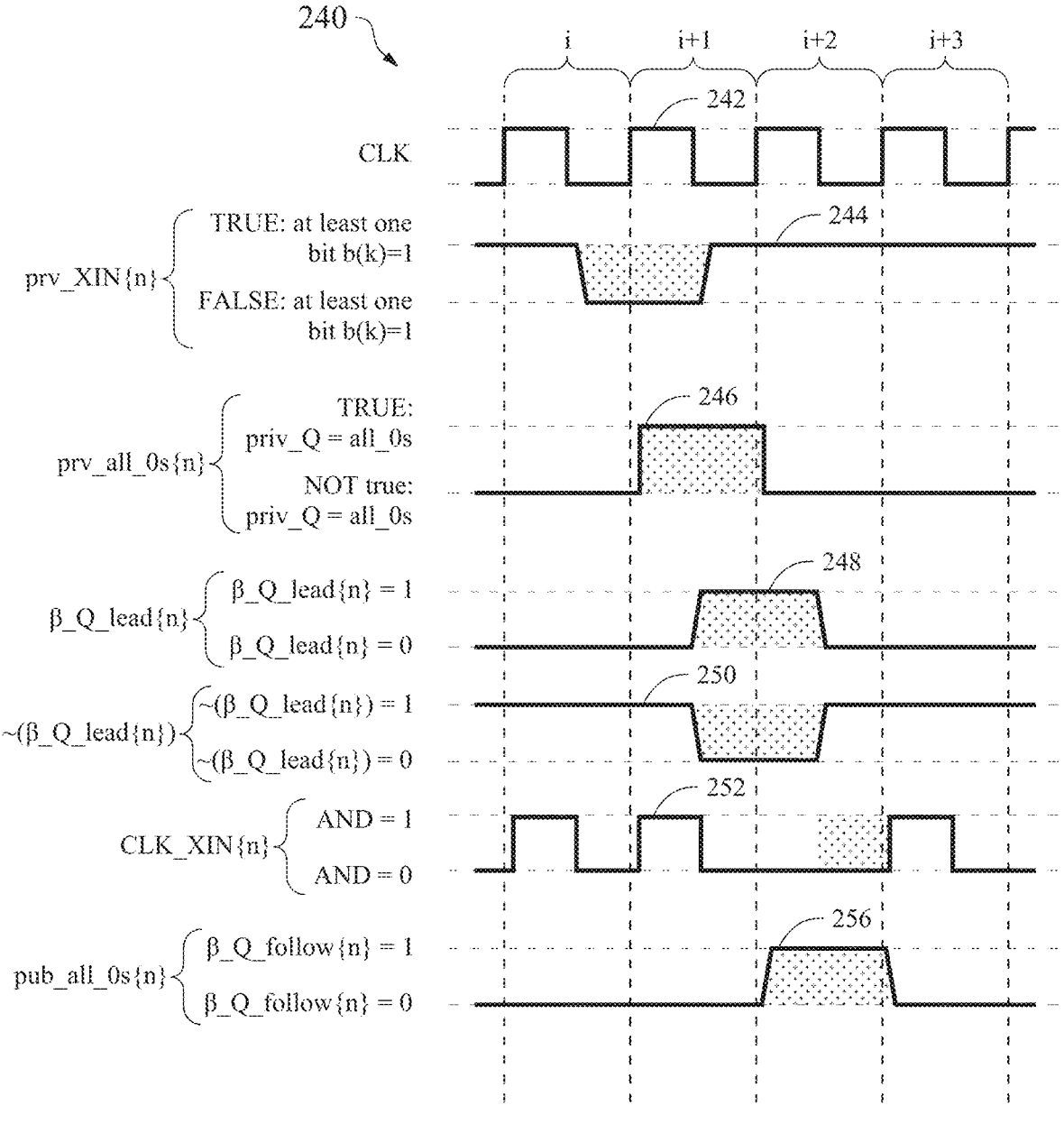
FIG. 2 is a set of waveforms, in accordance with some embodiments.

The operation of systems 100A-100B is discussed in more detail in the context of the set of waveforms of FIG. 2.

FIG. 2 is a set 240 of waveforms, in accordance with some embodiments.

Set 240 includes: a waveform 242 representing i_th, i+1_th, i+2_th and i+3_th cycles of global clock CLK; a waveform 244 representing data signal prv_XIN{n} output by SRAM array 132{n}; a waveform 246 representing nulling signal prv_all_0s{n} output by NOR gate 128{n}; a waveform 248 representing signal β_Q_lead{n} output by beta leader FF 124{n}; a waveform 250 representing an inverted version of signal β_Q_lead{n}, i.e., ~(β_Q_lead{n}); a waveform 252 representing local clock CLK_XIN{n} output by AND gate 130{n} of suspender unit 116{n}; and a waveform 254 representing signal β_Q_follow{n} output by beta follower FF 126{n} which represents signal pub_all_0s{n} output by suspender 126{n}.

When all bits b(k) of data signal prv_XIN{n} (waveform 244) become logical zero with the falling edge of global clock CLK (waveform 242) at cycle CLK(i), private nulling signal prv_all_0s{n} (waveform 246) becomes logical one with the rising edge of global clock cycle CLK(i+1). Because private nulling signal prv_all_0s{n} (waveform 246) is logical one at the falling edge of global clock cycle CLK(i+1), signal β_Q_lead{n} (waveform 248) becomes logical one and signal ~(β_Q_lead{n}) (waveform 250) becomes logical zero at the falling edge of global clock cycle CLK(i+1). Because signal β_Q_lead{n} (waveform 248) is logical one at the rising edge of global clock cycle CLK(i+2), signal β_Q_follow{n} becomes logical one at the rising edge of global clock cycle CLK(i+2).

Local clock signal CLK_XIN{n} follows global clock signal CLK{n} for CLK(i) and CLK(i+1). However, because signal ~(β_Q_lead{n}) (waveform 250) is logical zero at the rising edge of global clock cycle CLK(i+2), local clock CLK_XIN{n} remains at logical zero for first half of the i+2_th cycle of global clock CLK, i.e., for the first half of CLK(i+2).

For the second half of the i+2_th cycle of global clock CLK, i.e., for the first half of CLK(i+2), global clock CLK is logical zero, which causes local clock CLK_XIN{n} to remain at logical zero. As a result, latching by L/F FF 106{n}, i.e., latching by each of alpha leader FF 118{n} and alpha follower FF 120{n}, is suspended/suppressed during the i+2_th cycle of global clock CLK. That is, latching by each of alpha leader FF 118{n} and alpha follower FF 120{n}, is suspended/suppressed when all bits b(k) of private data signal prv_XIN{n} are logical zero.

According to another approach, a counterpart of systems 100A-100B does not include counterparts of suspender unit 116{n} and nuller 114{n}. According to the other approach, for a cycle in which all bits b(k) of a counterpart of data signal prv_XIN{n} are logical zero in value, nevertheless all bits b(k) are propagated through the other approach's counterpart of L/F FF 106{n} such that the other approach's counterpart of multiplier 108{n} multiplies the counterpart of weight signal W{n} by logical zero resulting in all bits of the counterpart of product signal being logical zero. In developing at least some of the present embodiments, one or more of the present inventors recognized at least the following: regardless of bit-value, propagating all bits b(k) of counterpart data signal prv_XIN{n} through the counterpart of L/F FF 106{n} consumes energy; and it is possible to make the product signal equal to logical zero without having to propagate all bit-values of bits b(k) of counterpart data signal prv_XIN{n} through the counterpart of L/F FF 106{n}, which presents an opportunity to reduce energy consumption as compared to the other approach. Accordingly, when all bits b(k) of private data signal prv_XIN[n] are logical zero, suspender unit 106{n} and nuller 114{n} of systems 100A-110B work together to achieve generation of public product signal pub_prod{n} with all bits b(k) equal logic zero without having to propagate the bit-values of all bits b(k) of private data signal prv_XIN{n} through L/F FF 106{n}. By avoiding such propagation, systems 100A-110B reduce energy consumption when all bits b(k) of private data signal prv_XIN[n] are logical zero as compared to the other approach.

Figure 3A:
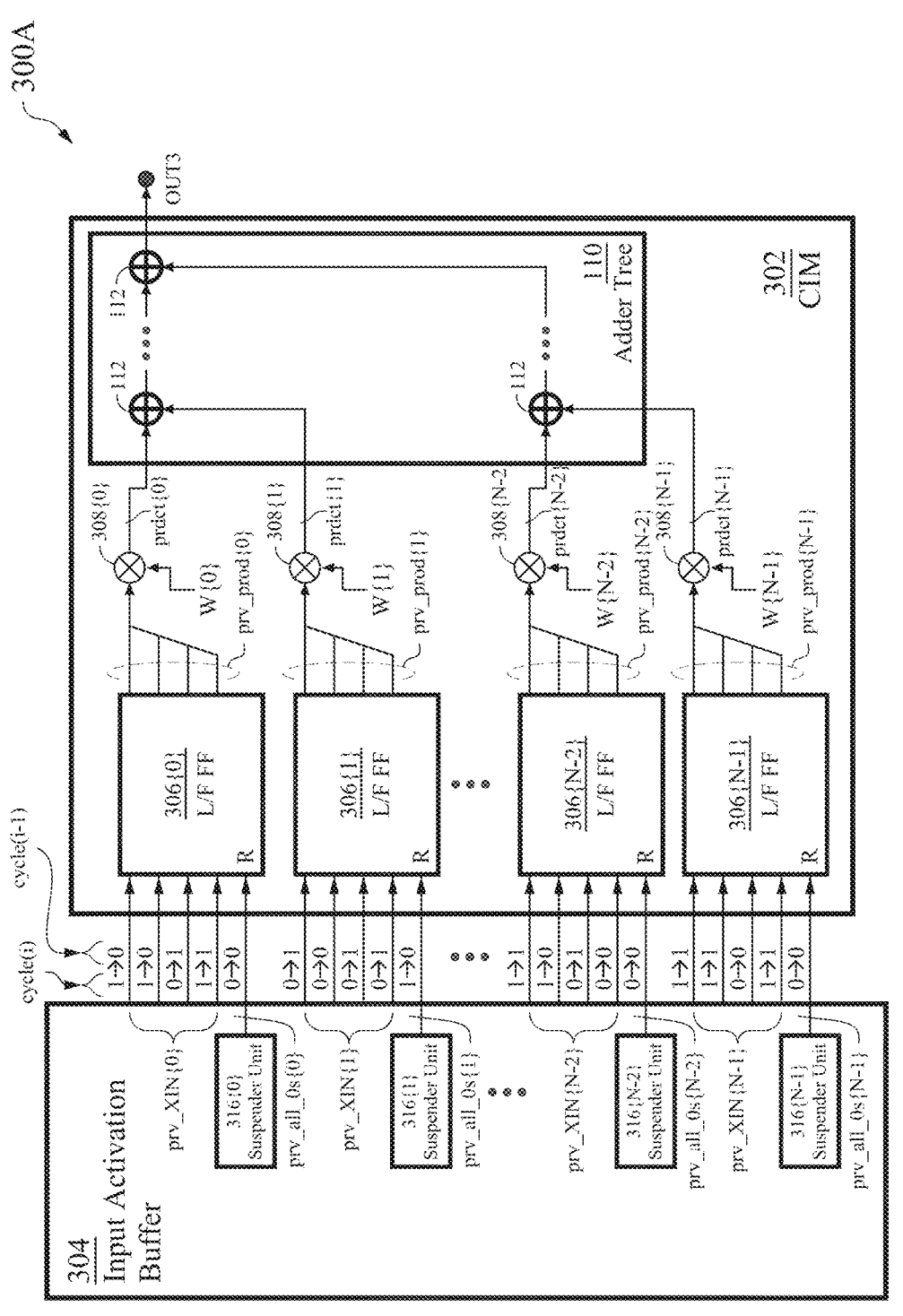
FIGS. 3A-3B are corresponding schematic diagrams, in accordance with some embodiments.

FIG. 3A is a schematic diagram of a system 300A, in accordance with some embodiments.

System 300A includes a CIM system 302 and an input activation buffer 304. System 300A is configured to reduce power consumption by CIM system 302.

CIM system 302 includes multibit L/F FFs 306{0}, 306{1}, . . . , 306{N-2} and 306{N-1}. An n_th example of L/F FFs 306{0}-306{N-1}, namely L/F FF 306{n}, is shown in in FIG. 3B. System 300A of FIG. 3A is similar to system 100A of FIG. 1A. For brevity, the discussion will focus on differences of system 300A as compared to system 100A rather than on similarities. System 300A does not include nullers 114{0}-114{N-1}. Rather, in system 300A, adder tree 110 is configured to receive product signals prdct{0}-prdct{N-1} from corresponding multipliers 308{0}-308{N-1}.

Suspender units 316{0}-316{N-1}(see FIG. 3B) are similar in some respects to suspender units 116{0}-116{N-1}. Suspender units 316{0}-316{N-1} generate corresponding nulling signals all_0s{0}, all_0s{1}, . . . , all_0s{n-1} and all_0s{N-1} which are counterparts to correspond to private nulling signals prv_all_0s{0}, prv_all_0s{1}, . . . , prv_all_0s{n−1} and prv_all_0s{N−1} generated by suspender units 116{0}-116{N−1}.

L/F FF units 306{0}-306{N−1} differ from L/F FF units 106{0}-106{N−1} in that L/F FF units 306{0}-306{N−1} are configured to receive a reset signal. More particularly, L/F FF units 306{0}-306{N−1} are configured to receive nulling signals all_0s{0}, all_0s{1}, . . . , all_0s{n−1} and all_0s{N−1} as corresponding reset signals.

Figure 3B:
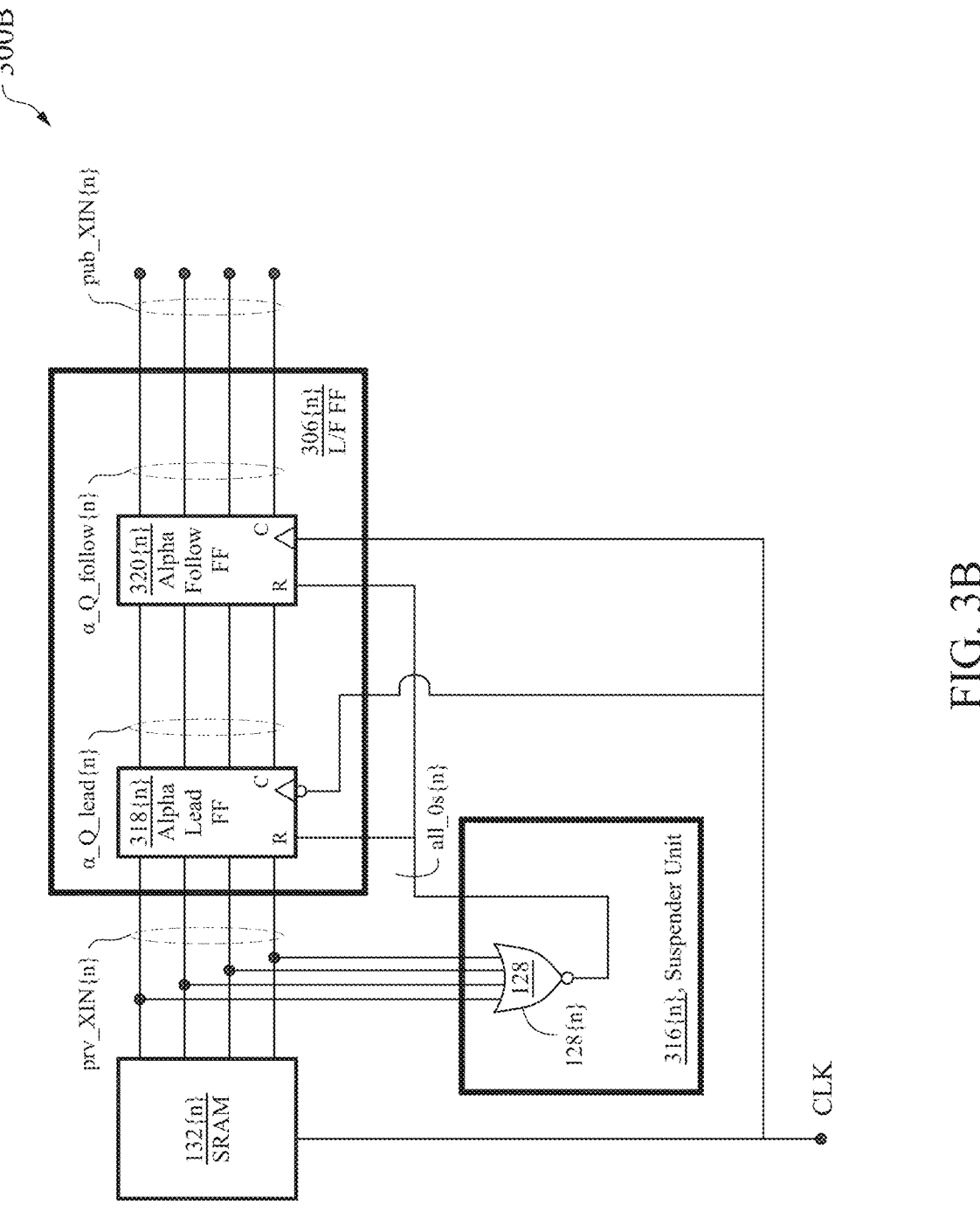

FIG. 3B is a schematic diagram of system 300B, in accordance with some embodiments.

System 300B is a version of system 300A that shows components of the latter in more detail, in accordance with some embodiments. For simplicity of discussion regarding FIG. 3B, it is assumed that suspender unit 316{n} is representative of suspender units 316{1}-316{N−1} of FIG. 3A. System 300B of FIG. 3B is similar to system 100B of FIG. 1B. For brevity, the discussion will focus on differences of system 300B as compared to system 100A rather than on similarities.

Suspender unit 316{n} does not include L/F FF 122{n} nor AND gate 130{n} of suspender unit 116{n}. A reset input of each of alpha leader FF 318{n} and alpha follower FF 320{n} is configured to receive nulling signal all_0s{n} from NOR gate 128{n} of suspender unit 316{n}.

Figure 4:
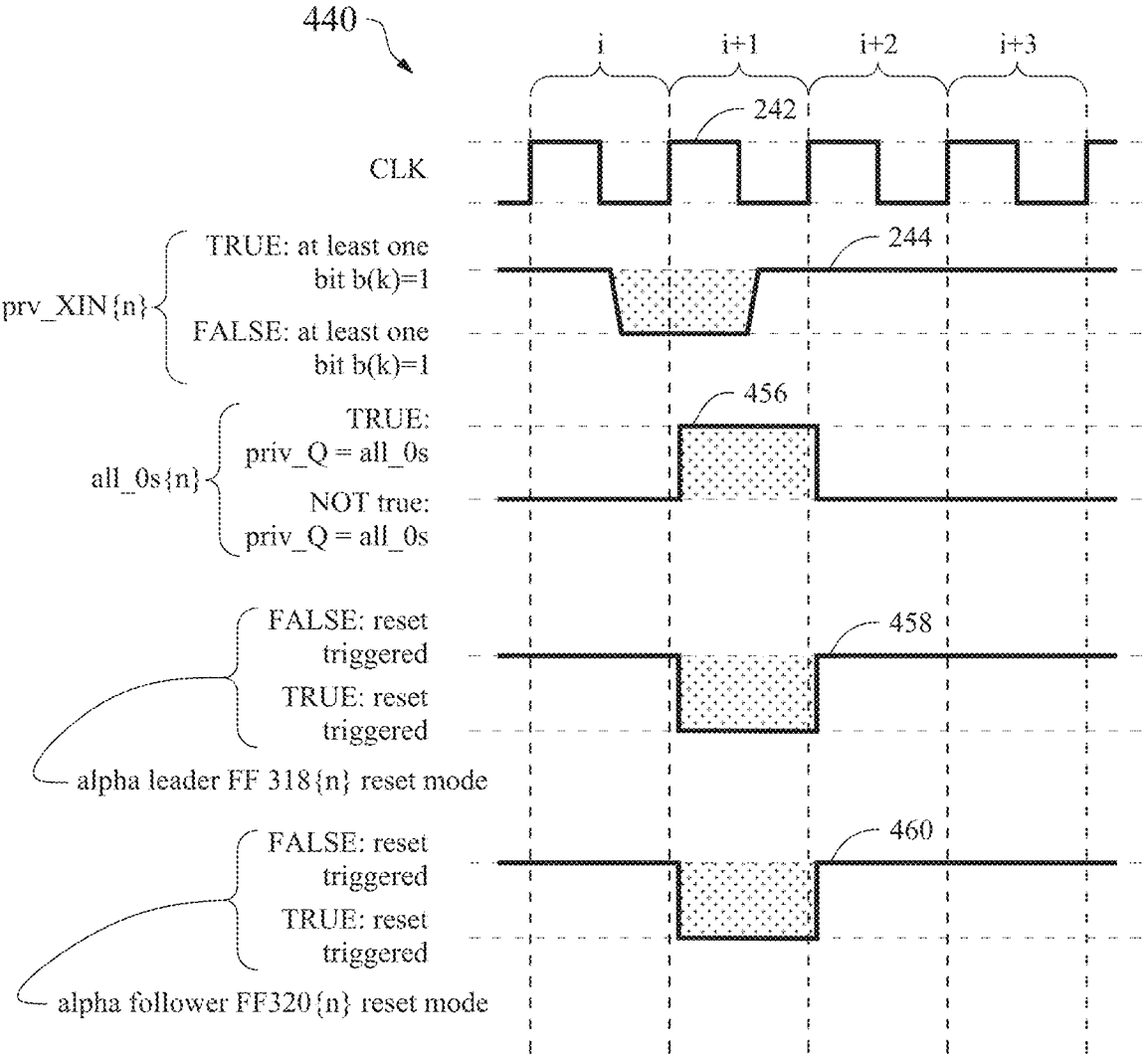
FIG. 4 is a set of waveforms, in accordance with some embodiments.

The operation of systems 300A-300B is discussed in more detail in the context of the set of waveforms of FIG. 4.

FIG. 4 is a set 440 of waveforms, in accordance with some embodiments.

Set 440 includes: waveform 242 (same as in FIG. 2) representing i_th, i+1_th, i+2_th and i+3_th cycles of global clock CLK; a waveform 244 (same as in FIG. 2) representing data signal prv_XIN{n} output by SRAM array 132{n}; a waveform 456 representing nulling signal all_0s{n} output by NOR gate 128{n}; a waveform 458 representing alpha leader FF 318{n} reset mode; and a waveform 460 representing alpha follower FF 320{n} reset mode.

Because nulling signal all_0s{n} (waveform 456) is logical zero at the rising edge of global clock cycle CLK(i), waveform 458 is logical one to indicate as being false that a reset of alpha leader FF 318{n} is triggered, i.e., no reset. Also because nulling signal all_0s{n} (waveform 456) is logical zero at the rising edge of global clock cycle CLK(i), waveform 460 is logical one to indicate as being false such that a reset of alpha follower FF 320{n} is triggered, i.e., no reset.

Because nulling signal all_0s{n} (waveform 456) is logical one at the rising edge of global clock cycle CLK(i+1), waveform 458 is logical zero to indicate as being true such that a reset of alpha leader FF 318{n} is triggered. Also because nulling signal all_0s{n} (waveform 456) is logical one at the rising edge of global clock cycle CLK(i), waveform 460 is logical zero to indicate as being true such that a reset of alpha follower FF 320{n} is triggered.

Because nulling signal all_0s{n} (waveform 456) is logical zero at the rising edge of global clock cycle CLK(i+2), waveform 458 is logical one to indicate as being false such that a reset of alpha leader FF 318{n} is triggered, i.e., no reset. Also because nulling signal all_0s{n} (waveform 456) is logical zero at the rising edge of global clock cycle CLK(i+2), waveform 460 is logical one to indicate as being false such that a reset of alpha follower FF 320{n} is triggered, i.e., no reset.

For each of alpha leader FF 318{n} and alpha follower FF 320{n}, undergoing a reset operation is mutually exclusive to undergoing a latching operation. As such, because alpha leader FF 318{n} and alpha follower FF 320{n} are triggered to reset, in effect, latching by each of alpha leader FF 318{n} and alpha follower FF 320{n} is suspended/suppressed when all bits b(k) of private data signal prv_XIN{n} are logical zero. Suspending/suppressing latching by each of alpha leader FF 318{n} and alpha follower FF 320{n} avoids having to propagate the bit-values of all bits b(k) of public product signal pub_prod{n} through L/F FF 306{n} when all bits b(k) of private data signal prv_XIN[n] are logical zero. By avoiding such propagation, systems 100A-110B reduce energy consumption when all bits b(k) of private data signal prv_XIN[n] are logical zero as compared to the other approach.

Figure 5:
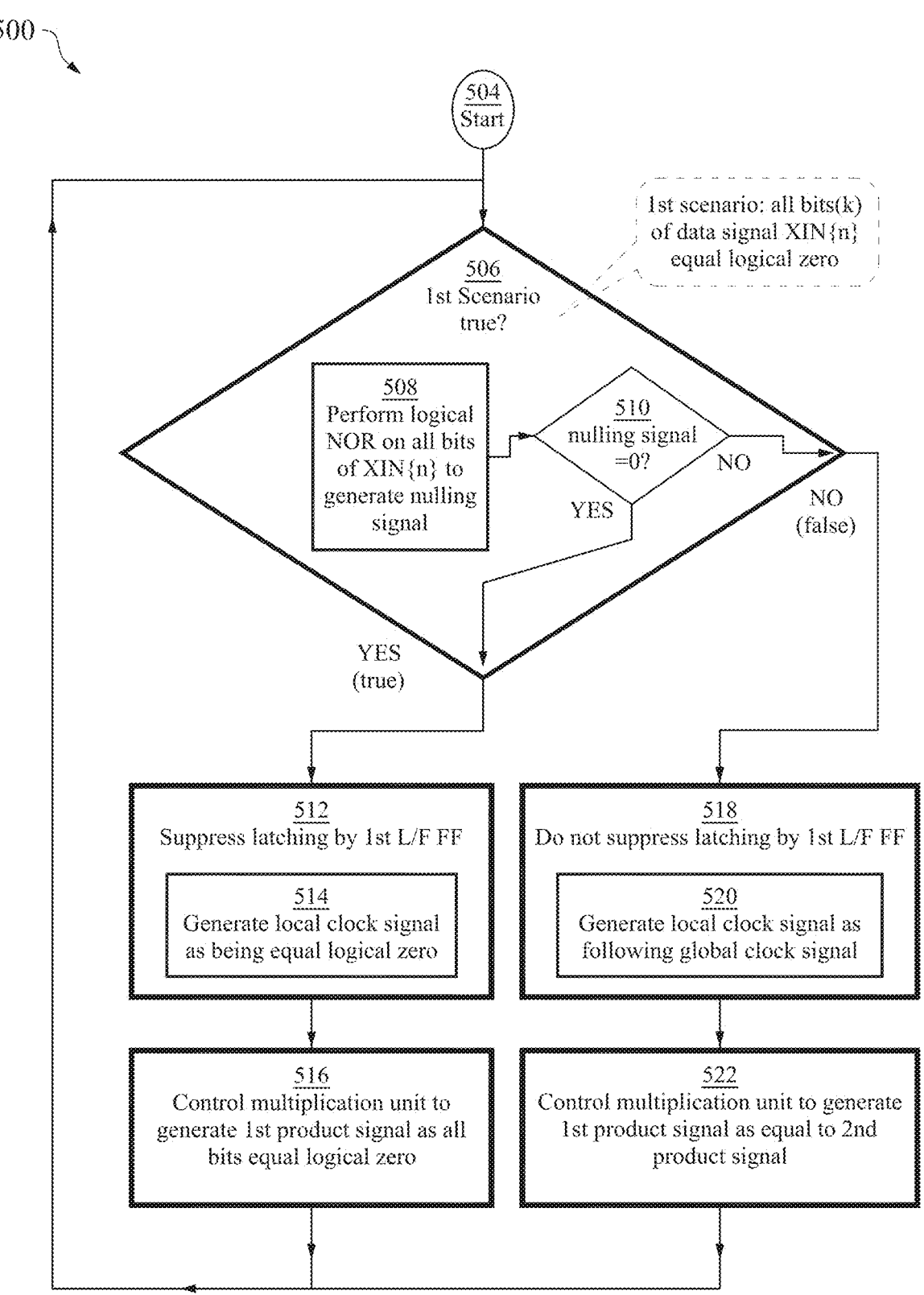
FIGS. 5-6 are flowcharts of corresponding methods, in accordance with some embodiments.

FIG. 5 is a flowchart of method 500, in accordance with some embodiments.

Method 500 is an example of a method by which a CIM system, e.g., CIM system 102 of FIG. 1A, or the like, is operated to reduce power consumption. Method 500 includes blocks 504-522. Flow according to method 500 begins at start block 504 and proceeds to decision block 506.

At decision block 506, it is determined whether a first scenario is true. The first scenario is where all bits b(k) of a data signal XIN{n} are equal logical zero. Examples of the data signal XIN{n} include private data signal prv_XIN{n} of FIGS. 1A-1B, 3A-3B, or the like. Within decision block 506, flow proceeds to block 508.

At block 508, a logical NOR operation is performed on all bits of the data signal XIN{n} to generate a nulling signal. Examples of the nulling signal including private nulling signal prv_all_0s{n} of FIG. 1B, nulling signal all_0s{n} of FIG. 3B, or the like. From block 508, flow proceeds to decision block 510.

At decision block 510, it is determined whether the nulling signal equals logical zero. If the nulling signal does equal zero, then flow proceeds out of the 'YES' exits correspondingly of decision block 510 and of decision block 506 and proceeds to block 512. If the nulling signal does not equal zero, then flow proceeds out of the 'NO' exits correspondingly of decision block 510 and of decision block 506 and proceeds to block 518.

At block 512, latching by a first L/F FF is suppressed. An example of the first L/F FF is L/F FF 106{n} of FIG. 1B, or the like. An example of latching by the first L/F FF being suppressed is discussed below in the context of block 514. Within block 512, flow proceeds to block 514.

At block 512, a local clock signal is generated as being logical zero. An example of the local clock signal is local clock signal CLK_XIN{n} of FIG. 1B, or the like. An example of local clock signal CLK_XIN{n} being logical zero is the value of waveform 252 of FIG. 2 during global clock cycle CLK(i+2), or the like. From block 514, flow exits block 512 and proceeds to block 516.

At block 516, a multiplication unit is controlled to generate a first product signal as all bits being equal logical zero. Examples of the multiplication unit include multiplication units 115{0}-115{N−1} of FIG. 1A, or the like. Examples of the first product signal include public product signals pub_prod{0}-pub_prod{N−1} of FIG. 1A, or the like. An example of controlling the multiplication unit to generate a first product signal as all bits being equal logical zero is providing public nulling signal pub_all_0s{1} to nuller 114{1} of FIG. 1A, or the like, and more particularly where nulling signal pub_all_0s{n} (waveform 256) is equal logical one in FIG. 2 for global clock cycle CLK(i+2), or the like. From block 516, flow loops back up to decision block 506 to iterate blocks 506-510 and one or more of blocks 512-522 for the next global clock cycle.

At block 518, latching by the first L/F FF is not suppressed. Again, an example of the first L/F FF is L/F FF 106{n} of FIG. 1B, or the like. An example of latching by the first L/F FF not being suppressed is discussed below in the context of block 520. Within block 518, flow proceeds to block 520.

At block 520, a local clock signal is generated as following a global clock. Again, an example of the local clock signal is local clock signal CLK_XIN{n} of FIG. 1B, or the like. An example of the global clock is global clock CLK of FIGS. 1A-1B, or the like. An example of local clock signal CLK_XIN{n} following global clock signal CLK is the value of waveform 252 of FIG. 2 during global clock cycles CLK(i), CLK(i+1) and CLK(i+3), or the like. From block 520, flow exits block 518 and proceeds to block 522.

At block 522, a multiplication unit is controlled to generate the first product signal as all bits being equal to all bits of a second product signal. Again, examples of the multiplication unit include multiplication units 115{0}-115{N−1} of FIG. 1A, or the like. Again, examples of the first product signal include public product signals pub_prod{0}-pub_prod{N−1} of FIG. 1A, or the like. Examples of the second product signal include private product signals prv_prod{0}-prv_prod{N−1} of FIG. 1A, or the like. An example of controlling the multiplication unit to generate the first product signal as all bits being equal to all bits of a second product signal is providing public nulling signal pub_all_0s{1} to nuller 114{1} of FIG. 1A, or the like, and more particularly where nulling signal pub_all_0s{n} (waveform 256) is equal logical zero in FIG. 2 for global clock cycles CLK(i), CLK(i+1) and CLK(i+3), or the like. From block 522, flow loops back up to decision block 506 to iterate blocks 506-510 and one or more of blocks 512-522 for the next global clock cycle.

Figure 6:
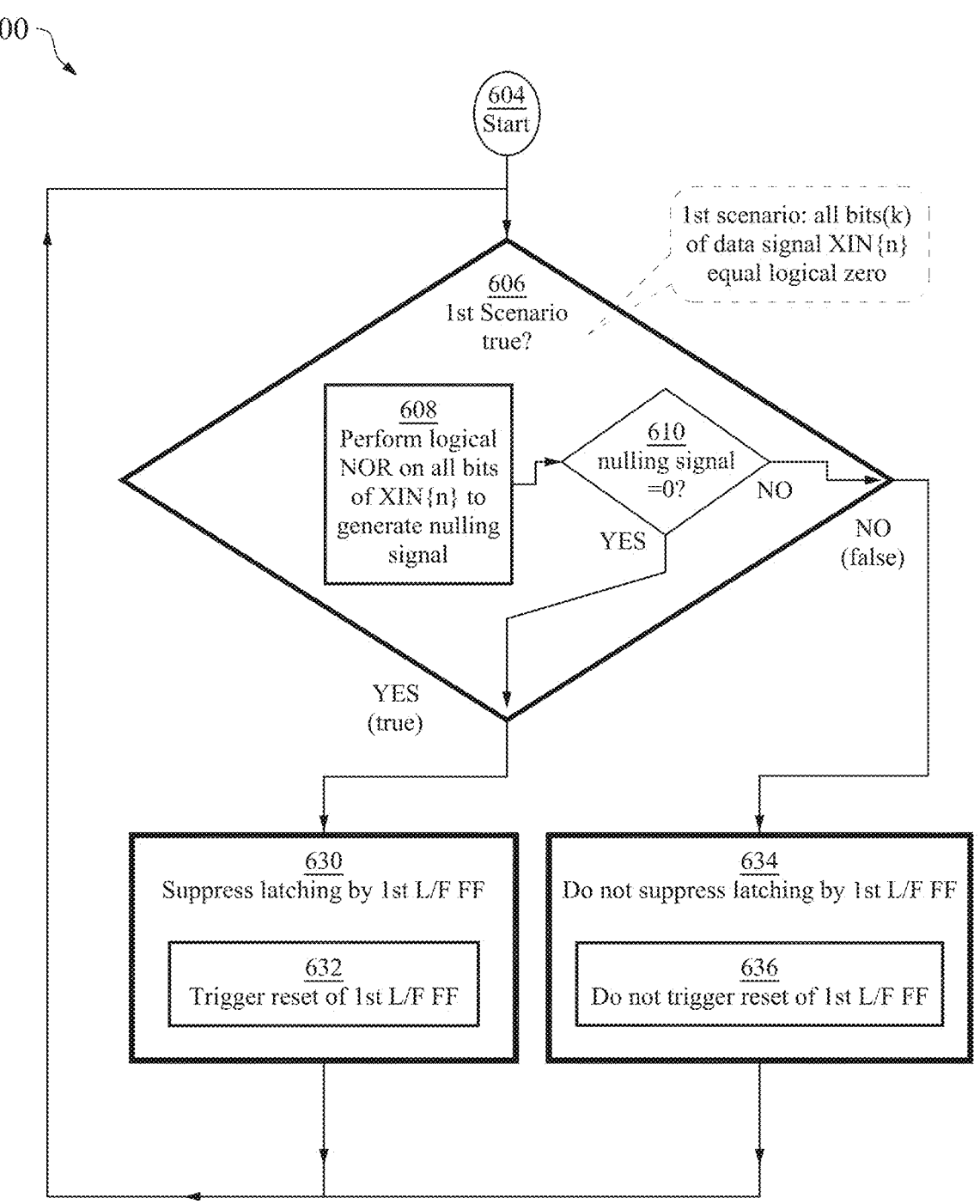

FIG. 6 is a flowchart of method 600, in accordance with some embodiments.

Method 600 is an example of a method by which a CIM system, e.g., CIM system 302 of FIG. 3A, or the like, is operated to reduce power consumption. Method 600 includes blocks 604-610 and 630-636. Flow according to method 600 begins at start block 604 and proceeds to decision block 606.

Decision block 606 is the same as decision block 506 of FIG. 5. Likewise, block 608 and decision block 610 are correspondingly the same as block 508 and decision block 510 of FIG. 5. If the nulling signal does equal zero, then flow proceeds out of the 'YES' exits correspondingly of decision block 610 and of decision block 606 and proceeds to block 630. If the nulling signal does not equal zero, then flow out of the 'NO' exits correspondingly of decision block 610 and of decision block 606 and proceeds to block 634.

At block 630, latching by a first L/F FF is suppressed. An example of the first L/F FF is L/F FF 306{n} of FIG. 3B, or the like. An example of latching by the first L/F FF being suppressed is discussed below in the context of block 632. Within block 630, flow proceeds to block 632.

At block 632, a reset of the first L/F FF is triggered. Recalling that L/F FF 306 includes alpha leader FF 318{n} and alpha follower FF 320{n}, an example of a reset of the first L/F being triggered is each of waveforms 458 and 460 of FIG. 4 being logical zero at the rising edge of global clock cycle CLK(i+1), or the like. It is to be recalled: waveform 458 of FIG. 4 being logical zero at the rising edge of global clock cycle CLK(i+1) indicates as being true that a reset of alpha leader FF 318{n} is triggered; waveform 460 of FIG. 4 being logical zero at the rising edge of global clock cycle CLK(i+1) indicates as being true that a reset of alpha follower FF 320{n} is triggered; for each of alpha leader FF 318{n} and alpha follower FF 320{n}, a reset operation is mutually exclusive to undergoing a latching operation; and for each of alpha leader FF 318{n} and alpha follower FF 320{n}, undergoing a reset operation, in effect, suspends/suppresses undergoing a latching operation.

From block 632, flow exits block 630 and loops back up to decision block 606 to iterate blocks 606-610 and one or more of blocks 630-632 for the next global clock cycle.

At block 634, latching by the first L/F FF is suppressed. An example of the first L/F FF is L/F FF 306{n} of FIG. 3B, or the like. An example of latching by the first L/F FF not being suppressed is discussed below in the context of block 636. Within block 634, flow proceeds to block 636.

At block 636, a reset of the first L/F FF is not triggered. Recalling that L/F FF 306 includes alpha leader FF 318{n} and alpha follower FF 320{n}, an example of a reset of the first L/F not being triggered is each of waveforms 458 and 460 of FIG. 4 being logical one at the rising edge of global clock cycles CLK(i), CLK(i+2) and CLK(i+3), or the like. It is to be recalled: waveform 458 of FIG. 4 being logical one at the rising edge of global clock cycles CLK(i), CLK(i+2) and CLK(i+3) indicates as being true that a reset of alpha leader FF 318{n} is not triggered; waveform 460 of FIG. 4 being logical one at the rising edge of global clock cycles CLK(i), CLK(i+2) and CLK(i+3) indicates as being true that a reset of alpha follower FF 320{n} is not triggered; for each of alpha leader FF 318{n} and alpha follower FF 320{n}, a reset operation is mutually exclusive to undergoing a latching operation; and for each of alpha leader FF 318{n} and alpha follower FF 320{n}, not undergoing a reset operation, in effect, does not suspend/suppress undergoing a latching operation.

From block 636, flow exits block 634 and loops back up to decision block 606 to iterate blocks 606-610 and one or more of blocks 634-636 for the next global clock cycle.

In some embodiments, a compute-in-memory (CIM) system includes: a first leader-follower (L/F) flip-flop (FF) configured to receive a multibit data signal and generate a multibit output signal, the first L/F FF including a first leader FF configured to receive the data signal and generate a signal first_Q_lead, and a first follower FF configured to receive the signal first_Q_lead and generate a signal first_Q_follow that represents the output signal of the first L/F FF; at an i−1_th cycle of a first clock signal, at least one bit b(k) of data signal being equal to logical one, where i and k are corresponding integers; a multiplication unit configured to receive a multibit weight signal and the signal first_Q_follow and generate a first product signal; and a suspender unit configured, during an i_th cycle of the first clock signal, to do as follows including detect that a first scenario is true in which all bits b(k) of the data signal equal logical zero, and, when the first scenario is true, suppress latching from being performed by the first L/F FF and control the multiplication unit to generate the first product signal as being equal to logical zero.

In some embodiments, the multiplication unit includes: a multiplier configured to receive the weight signal and the signal first_Q_follow and multiply the same together to generate a second product signal; and the suspender unit is further configured to control the multiplication unit to generate the first product signal as being equal to the second product signal when the first scenario is false.

In some embodiments, the suspender unit is further configured to generate a first scenario-state signal as being in an active state when the first scenario is true; and the multiplication unit further includes a logic unit configured to receive the second product signal and the first scenario-state signal and to generate the first product signal as being equal to the second product signal or as all bits being equal to logical zero according to the first scenario-state signal.

In some embodiments, for a bit b(k) of the second product signal, and relative to the first scenario-state signal, the logic unit is configured to generate a bit b(k) of the first product signal to have a truth table as follows:

| first scenario-state signal | bit b(k) of second product signal | bit b(k) of first product signal |
|---|---|---|
| 0 | 0 | 0 |
| 0 | 1 | 1 |
| 1 | 0 | 0 |
| 1 | 1 | 0. |

In some embodiments, the suspender unit includes: a first scenario-state detector configured to generate a first scenario-state signal as being in an active state when the first scenario is true; and a second L/F FF configured to receive the first scenario-state signal and generate a multibit output signal, the second L/F FF including a second leader FF configured to receive the first scenario-state signal and generate a signal second_Q_lead, and a second follower FF configured to receive the signal second_Q_lead and generate a signal second_Q_follow that represents the output signal of the second L/F FF; the multiplication unit includes a multiplier configured to receive the weight signal and the signal first_Q_follow and multiply the same together to generate a second product signal; and the multiplication unit is further configured to generate the first product signal as being equal to the second product signal or as all bits being equal to logical zero according to the first scenario-state signal.

In some embodiments, the first scenario-state detector is a logical NOR gate configured to receive all bits of the data signal and generate the first scenario-state signal.

In some embodiments, the suspender unit further includes a suppression unit configured to receive the first clock signal and the signal second_Q_lead and based thereon generate a second clock signal that is an inactive state when the first scenario is true and follows the first clock signal when the first scenario is true; the first leader FF is further configured to be gated according to the second clock signal; and the first follower FF is further configured to be gated according to an inverted version of the second clock signal.

In some embodiments, the suppression unit includes a logical AND gate configured to receive the first clock signal and an inverted version of the signal second_Q_lead and generate the second clock signal.

In some embodiments, a method (of reducing power consumption in a compute-in-memory (CIM) system) includes: during an i_th cycle of a first clock signal, doing as follows including: detecting that a first scenario is true in which all bits b(k) of a multibit data signal equal logical zero, where i and k are corresponding integers; when the first scenario is true, suppressing performance of latching by a first leader-follower (L/F) flip-flop (FF), at least one bit b(k) of a multibit data signal being equal to logical one during an i−1_th cycle of a first clock signal, the first L/F FF configured to receive the data signal and generate a multibit output signal, the first L/F FF including a first leader FF configured to receive the data signal and generate a signal first_Q_lead, and a first follower FF configured to receive the signal first_Q_lead and generate a signal first_Q_follow that represents the output signal of the first L/F FF; and when the first scenario is true, for a multiplication unit configured to receive a multibit weight signal and the signal first_Q_follow and generate a first product signal, controlling the multiplication unit to generate the first product signal as all bits being equal to logical zero.

In some embodiments, the multiplication unit includes a multiplier configured to receive the weight signal and the signal first_Q_follow and multiply the same together to generate a second product signal; and the method further includes: controlling the multiplication unit to generate the first product signal as being equal to the second product signal when the first scenario is false.

In some embodiments, the method further includes: generating a first scenario-state signal as being in an active state when the first scenario is true; and wherein the controlling the multiplication unit to generate the first product signal results in the first product signal being equal to the second product signal or as all bits being equal to logical zero according to the first scenario-state signal.

In some embodiments, for a bit b(k) of the second product signal, and relative to the first scenario-state signal, the controlling the multiplication unit to generate the first product signal results in a bit b(k) of the first product signal representing a truth table as follows:

| first scenario-state signal | bit b(k) of second product signal | bit b(k) of first product signal |
|---|---|---|
| 0 | 0 | 0 |
| 0 | 1 | 1 |
| 1 | 0 | 0 |
| 1 | 1 | 0. |

In some embodiments, the method further includes: generating a first scenario-state signal as being in an active state when the first scenario is true; and the CIM system further includes a second L/F FF configured to receive the first scenario-state signal and generate a multibit output signal, the second L/F FF including a second leader FF configured to receive the first scenario-state signal and generate a signal second_Q_lead, and a second follower FF configured to receive the signal second_Q_lead and generate a signal second_Q_follow that represents the output signal of the second L/F FF, and the multiplication unit includes a multiplier configured to receive the weight signal and the signal first_Q_follow and multiply the same together to generate a second product signal; and the method further includes controlling the multiplication unit to generate the first product signal as being equal to the second product signal or as all bits being equal to logical zero according to the first scenario-state signal.

In some embodiments, the suppressing performance of latching includes performing a logical NOR operation on all bits of the data signal to generate the first scenario-state signal.

In some embodiments, the method further includes, based on the first clock signal and the signal second_Q_lead, generating a second clock signal that is an inactive state when the first scenario is true and follows the first clock signal when the first scenario is not true; gating the first leader FF according to the second clock signal; and gating the first follower FF according to an inverted version of the second clock signal.

In some embodiments, the generating a second clock signal includes: performing a logical AND operation on the first clock signal and an inverted version of the signal second_Q_lead resulting in the second clock signal.

In some embodiments, a compute-in-memory (CIM) system includes: a first leader-follower (L/F) flip-flop (FF) configured to receive a multibit data signal and generate a multibit output signal, the first L/F FF including a first leader FF configured to receive the data signal and generate a signal first_Q_lead, and a first follower FF configured to receive the signal first_Q_lead and generate a signal first_Q_follow that represents the output signal of the first L/F FF; at an i−1_th cycle of a first clock signal, at least one bit b(k) of data signal being equal to logical one, where i and k are corresponding integers; a multiplier configured to receive a multibit weight signal and the signal first_Q_follow and generate a first product signal; and a suspender unit configured, during an i_th cycle of the first clock signal, to do as follows including detect that a first scenario is true in which all bits b(k) of the data signal equal logical zero, and, when the first scenario is true, trigger a reset operation to be performed by the first L/F FF such that all bits of the signal first_Q_follow are made equal to logical zero.

In some embodiments, the suspender unit includes a first scenario-state detector configured to generate a first scenario-state signal at an output node thereof; and the first scenario-state detector is further configured to generate the first scenario-state signal in an active state when the first scenario is true.

In some embodiments, the first scenario-state detector is a logical NOR gate configured to receive all bits of the data signal and generate the first scenario-state signal.

In some embodiments, each of the first leader FF and the first follower FF includes a reset node which is coupled to the output node of the first scenario-state detector such that the first scenario-state detector is further configured to trigger the reset operation by generating the first scenario-state signal in the active state.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A compute-in-memory (CIM) system comprising:
a first leader-follower (L/F) flip-flop (FF) configured to receive a multibit data signal and generate a multibit output signal, the first L/F FF including:
a first leader FF configured to receive the data signal and generate a signal first_Q_lead; and
a first follower FF configured to receive the signal first_Q_lead and generate a signal first_Q_follow that represents the output signal of the first L/F FF;
at an i−1_th cycle of a first clock signal, at least one bit b(k) of data signal being equal to logical one, where i and k are corresponding integers;
a multiplication unit configured to receive a multibit weight signal and the signal first_Q_follow and generate a first product signal; and
a suspender unit configured, during an i_th cycle of the first clock signal, to do as follows including:
detect that a first scenario is true in which all bits b(k) of the data signal equal logical zero; and
when the first scenario is true,
suppress latching from being performed by the first L/F FF, and control the multiplication unit to generate the first product signal as being equal to logical zero.

2. The CIM system of claim 1, wherein:
the multiplication unit includes:
a multiplier configured to receive the weight signal and the signal first_Q_follow and multiply the same together to generate a second product signal; and
the suspender unit is further configured to control the multiplication unit to generate the first product signal as being equal to the second product signal when the first scenario is false.

3. The CIM system of claim 2, wherein:
the suspender unit is further configured to:
generate a first scenario-state signal as being in an active state when the first scenario is true; and
the multiplication unit further includes:
a logic unit configured to receive the second product signal and the first scenario-state signal and to generate the first product signal as being equal to the second product signal or as all bits being equal to logical zero according to the first scenario-state signal.

4. The CIM system of claim 3, wherein:
for a bit b(k) of the second product signal, and
relative to the first scenario-state signal, the logic unit is configured to generate a bit b(k) of the first product signal to have a truth table as follows:

| first scenario-state signal | bit b(k) of second product signal | bit b(k) of first product signal |
|---|---|---|
| 0 | 0 | 0 |
| 0 | 1 | 1 |
| 1 | 0 | 0 |
| 1 | 1 | 0. |

5. The CIM system of claim 1, wherein:
the suspender unit includes:
a first scenario-state detector configured to generate a first scenario-state signal as being in an active state when the first scenario is true; and
a second L/F FF configured to receive the first scenario-state signal and generate a multibit output signal, the second L/F FF including:
a second leader FF configured to receive the first scenario-state signal and generate a signal second_Q_lead, and
a second follower FF configured to receive the signal second_Q_lead and generate a signal second_Q_follow that represents the output signal of the second L/F FF;
the multiplication unit includes:
a multiplier configured to receive the weight signal and the signal first_Q_follow and multiply the same together to generate a second product signal; and
the multiplication unit is further configured to generate the first product signal as being equal to the second product signal or as all bits being equal to logical zero according to the first scenario-state signal.

6. The CIM system of claim 5, wherein:
the first scenario-state detector is a logical NOR gate configured to receive all bits of the data signal and generate the first scenario-state signal.

7. The CIM system of claim 5, wherein:

the suspender unit further includes:

a suppression unit configured to receive the first clock signal and the signal second_Q_lead and based thereon generate a second clock signal that:

is an inactive state when the first scenario is true; and follows the first clock signal when the first scenario is true;

the first leader FF is further configured to be gated according to the second clock signal; and the first follower FF is further configured to be gated according to an inverted version of the second clock signal.

8. The CIM system of claim 7, wherein:

the suppression unit includes:

a logical AND gate configured to receive the first clock signal and an inverted version of the signal second_Q_lead and generate the second clock signal.

9. A method of reducing power consumption in a compute-in-memory (CIM) system, the method comprising:

during an i_th cycle of a first clock signal, doing as follows including:

detecting that a first scenario is true in which all bits b(k) of a multibit data signal equal logical zero, where i and k are corresponding integers; and when the first scenario is true, suppressing performance of latching by a first leader-follower (L/F) flip-flop (FF), at least one bit b(k) of the data signal having been equal to logical one during an i−1_th cycle of a first clock signal, the first L/F FF being configured to receive the data signal and generate a multibit output signal, the first L/F FF including a first leader FF configured to receive the data signal and generate a signal first_Q_lead, and a first follower FF configured to receive the signal first_Q_lead and generate a signal first_Q_follow that represents the output signal of the first L/F FF; and when the first scenario is true, for a multiplication unit configured to receive a multibit weight signal and the signal first_Q_follow and generate a first product signal, controlling the multiplication unit to generate the first product signal as all bits being equal to logical zero.

10. The method of claim 9, wherein:

the multiplication unit includes a multiplier configured to receive the weight signal and the signal first_Q_follow and multiply the same together to generate a second product signal; and the method further comprises:

controlling the multiplication unit to generate the first product signal as being equal to the second product signal when the first scenario is false.

11. The method of claim 10, wherein the method further comprises:

generating a first scenario-state signal as being in an active state when the first scenario is true; and wherein:

the controlling the multiplication unit to generate the first product signal results in the first product signal being equal to the second product signal or as all bits being equal to logical zero according to the first scenario-state signal.

12. The method of claim 11, wherein:

for a bit b(k) of the second product signal, and relative to the first scenario-state signal, the controlling the multiplication unit to generate the first product signal results in a bit b(k) of the first product signal representing a truth table as follows:

| first scenario-state signal | bit b(k) of second product signal | bit b(k) of first product signal |
|---|---|---|
| 0 | 0 | 0 |
| 0 | 1 | 1 |
| 1 | 0 | 0 |
| 1 | 1 | 0. |

13. The method of claim 9, wherein:

the method further comprises:

generating a first scenario-state signal as being in an active state when the first scenario is true; and the CIM system further includes a second L/F FF configured to receive the first scenario-state signal and generate a multibit output signal, the second L/F FF including a second leader FF configured to receive the first scenario-state signal and generate a signal second_Q_lead, and a second follower FF configured to receive the signal second_Q_lead and generate a signal second_Q_follow that represents the output signal of the second L/F FF, and the multiplication unit includes a multiplier configured to receive the weight signal and the signal first_Q_follow and multiply the same together to generate a second product signal; and the method further comprises:

controlling the multiplication unit to generate the first product signal as being equal to the second product signal or as all bits being equal to logical zero according to the first scenario-state signal.

14. The method of claim 13, wherein:

the suppressing performance of latching includes performing a logical NOR operation on all bits of the data signal to generate the first scenario-state signal.

15. The method of claim 13, wherein the method further comprises:

based on the first clock signal and the signal second_Q_lead, generating a second clock signal that:

is an inactive state when the first scenario is true; and follows the first clock signal when the first scenario is not true;

gating the first leader FF according to the second clock signal; and gating the first follower FF according to an inverted version of the second clock signal.

16. The method of claim 15, wherein:

the generating a second clock signal includes:

performing a logical AND operation on the first clock signal and an inverted version of the signal second_Q_lead resulting in the second clock signal.

17. A compute-in-memory (CIM) system comprising:

a first leader-follower (L/F) flip-flop (FF) configured to receive a multibit data signal and generate a multibit output signal, the first L/F FF including:

a first leader FF configured to receive the data signal and generate a signal first_Q_lead, and a first follower FF configured to receive the signal first_Q_lead and generate a signal first_Q_follow that represents the output signal of the first L/F FF;

at an i–1_th cycle of a first clock signal, at least one bit b(k) of data signal being equal to logical one, where i and k are corresponding integers;

a multiplier configured to receive a multibit weight signal and the signal first_Q_follow and generate a first product signal; and a suspender unit configured, during an i_th cycle of the first clock signal, to do as follows including:

detect that a first scenario is true in which all bits b(k) of the data signal equal logical zero; and when the first scenario is true, trigger a reset operation to be performed by the first L/F FF such that all bits of the signal first_Q_follow are made equal to logical zero.

18. The CIM system of claim 17, wherein:
the suspender unit includes:
a first scenario-state detector configured to generate a first scenario-state signal at an output node thereof; and
the first scenario-state detector is further configured to generate the first scenario-state signal in an active state when the first scenario is true.

19. The CIM system of claim 18, wherein:
the first scenario-state detector is a logical NOR gate configured to receive all bits of the data signal and generate the first scenario-state signal.

20. The CIM system of claim 18, wherein:
each of the first leader FF and the first follower FF includes a reset node which is coupled to the output node of the first scenario-state detector such that the first scenario-state detector is further configured to trigger the reset operation by generating the first scenario-state signal in the active state.

* * * * *